United States Patent
Ouvrier-Buffet et al.

(10) Patent No.: US 7,205,545 B2
(45) Date of Patent: Apr. 17, 2007

(54) ELECTROMAGNETIC RADIATION DETECTION DEVICE WITH INTEGRATED HOUSING COMPRISING TWO SUPERPOSED DETECTORS

(75) Inventors: Jean-Louis Ouvrier-Buffet, Sévrier (FR); Damien Morel, Meylan (FR); Nicolas Massoni, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 111 days.

(21) Appl. No.: 10/524,775

(22) PCT Filed: Sep. 11, 2003

(86) PCT No.: PCT/FR03/02696

§ 371 (c)(1),
(2), (4) Date: Mar. 24, 2005

(87) PCT Pub. No.: WO2004/025694

PCT Pub. Date: Mar. 25, 2004

(65) Prior Publication Data
US 2006/0043297 A1 Mar. 2, 2006

(30) Foreign Application Priority Data
Sep. 16, 2002 (FR) .................................. 02 11457

(51) Int. Cl.
*G01J 5/02* (2006.01)

(52) U.S. Cl. ................................................. 250/339.05
(58) Field of Classification Search ............ 250/339.05
See application file for complete search history.

(56) References Cited

U.S. PATENT DOCUMENTS

| | | | | |
|---|---|---|---|---|
| 3,987,298 | A | * 10/1976 | Rotolante | ................... 257/442 |
| 5,631,460 | A | * 5/1997 | Gray et al. | ................. 250/226 |
| 6,157,020 | A | 12/2000 | Krapf et al. | |
| 6,320,189 | B1 | 11/2001 | Ouvrier-Buffet et al. | |

* cited by examiner

*Primary Examiner*—David Porta
*Assistant Examiner*—Marcus Taningco
(74) *Attorney, Agent, or Firm*—Oliff & Berridge, PLC

(57) ABSTRACT

The invention concerns an electromagnetic radiation sensing device with integrated housing including two superimposed sensors. A first sensor detects one first wavelength range, and a second sensor detects a second wavelength range. The first sensor is arranged inside a protective housing, whereof at least the upper wall includes the second sensor. The wavelengths of the first range, for example included in the infrared domain are, preferably, greater than the wavelengths of the second range, which can be included in the visible or ultraviolet domain. The first sensor is, preferably, a bolometer comprising a sensitive elements and support element forming electrical connection elements between the first sensor and/or the second sensor and an electronic processing circuit.

14 Claims, 3 Drawing Sheets

ELECTROMAGNETIC RADIATION DETECTION DEVICE WITH INTEGRATED HOUSING COMPRISING TWO SUPERPOSED DETECTORS

BACKGROUND OF THE INVENTION

The invention relates to an electromagnetic radiation detection device comprising two superposed detectors, a first non-cooled detector detecting a first range of wavelengths and a second non-cooled detector detecting a second range of wavelengths.

STATE OF THE ART

Known multi-spectral detection systems, i.e. able to detect several different wave-length ranges, can be juxtaposed or superposed. Thus in the infrared field, multi-spectral systems are achieved from a stack of epitaxial layers of $Cd_xHg_{1-x}Te$ with a composition varying with x themselves epitaxied on a substrate transparent to infrared radiation. The absorption bands are determined by the composition of the detecting layers. The detectors achieved in these layers are of photovoltaic type and operate at low temperature, in the wavelength range comprised between about 1 and 12 microns, and therefore outside the visible radiation spectrum.

In the infrared and visible field, detection systems are achieved using two cameras which respectively explore the infrared and visible spectral bands. The infrared camera is formed by cooled detectors, made of InSb or $Cd_xHg_{1-x}Te$, respectively detecting the band II and the bands II and III in the infrared spectrum. The visible camera can be achieved by means of a component of charge-coupled device (CCD) type.

Other systems use juxtaposition of cooled infrared $Cd_xHg_{1-x}Te$ detectors and silicon visible detectors. The radiation emanating from the observed scene is then split into two beams which are then focussed on each type of detector. These systems use cooled, and therefore relatively expensive and complex to implement, infrared detectors.

The document U.S. Pat. No. 6,107,618 describes a multi-spectral system comprising visible detectors and infrared detectors which can be adjacent or superposed.

The document U.S. Pat. No. 6,320,189 describes a multi-spectral infrared/visible detection apparatus using a bolometric detector and a photodetector superposed and combined with one another to form a same sensitive unit. Thus, the detection apparatus comprises a micro-bridge provided with pillars designed to support active elements such as an element sensitive to infrared radiation and electrodes, the micro-bridge being connected to a multiplexing circuit arranged under the micro-bridge and wherein the photodetector can be housed.

OBJECT OF THE INVENTION

The object of the invention is to provide a detection device having small dimensions and enabling two wavelength ranges to be detected from a same incident beam, without having to separate it into two beams, while optimizing the performances of the two detectors.

According to the invention, this object is achieved by the fact that the first detector is arranged inside a protective housing, at least a top wall of the protective housing comprising the second detector.

According to a first development of the invention, the wavelengths of the first range are higher than the wavelengths of the second range.

According to a second development of the invention, the housing comprises a base formed by an electronic processing circuit, whereon the first detector is mounted.

According to a preferred embodiment, the first range of wavelengths is comprised in the infrared range.

According to another feature of the invention, the second range of wavelengths is comprised in the visible or ultraviolet range.

According to another embodiment of the invention, the detection device comprises a plurality of first detectors arranged inside the same protective housing. The wall of the housing preferably comprises a plurality of reticulated zones arranged above each first detector, in such a way that each reticulated zone comprises a second detector.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

The electromagnetic radiation detection device is advantageously achieved by technologies used in the microelectronics field. It comprises two superposed detectors. A first non-cooled detector detects a first range of wavelengths and a second non-cooled detector detects a second range of wavelengths.

The first non-cooled detector preferably detects a first range of wavelengths comprised in the infrared range. The first detector is arranged inside a protective housing. It can for example be formed by a thermocouple, a diode or preferably a non-cooled thermal detector such as a bolometer of known type, for example as represented in FIG. 1.

Figure 1:
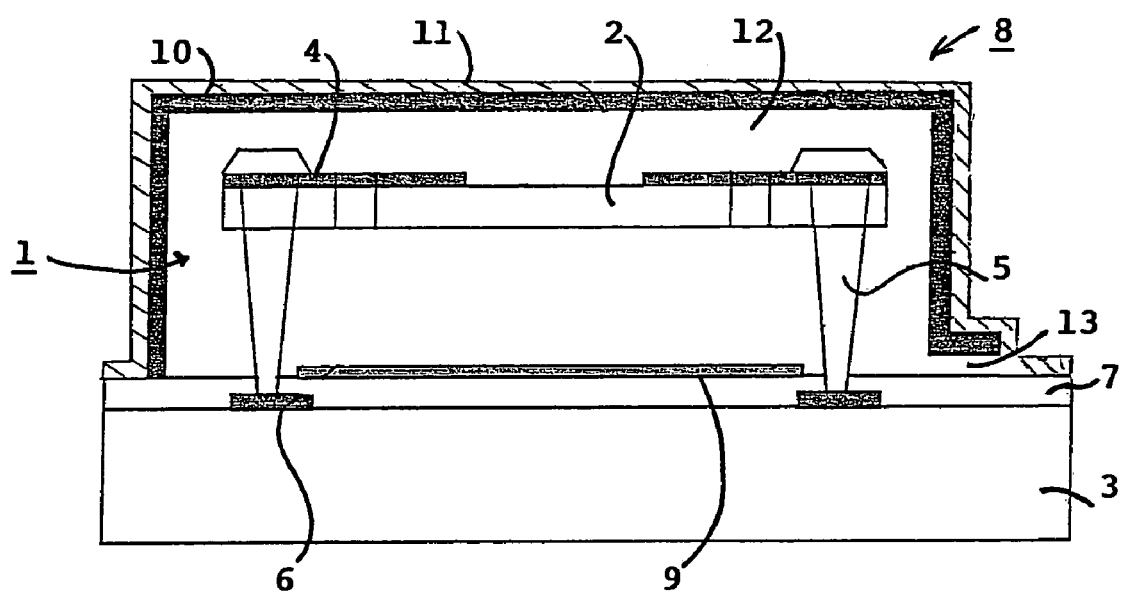
FIG. 1 is a schematic cross-sectional representation of an infrared detector according to the prior art.

In FIG. 1, the bolometer 1, operating at ambient temperature, comprises at least one sensitive element 2, in the form of a thin layer, connected to an electronic processing circuit 3. The circuit 3 can for example be in the form of thin layers in silicon technology, of CMOS or CCD type. The circuit 3 and sensitive element sensible 2 are arranged in parallel manner. The sensitive element 2 is designed to be heated by infrared radiation comprised in the 8 μm to 14 μm, or 3 μm to 5 μm, wavelength range, the infrared radiation being characteristic of the temperature and of the emissive properties of the bodies observed by the detection device.

The temperature increase of the sensitive element 2 generates a variation of one of the electrical properties of the sensitive element 2. This variation can for example be an appearance of electrical charges by pyroelectric effect, a capacitance variation by change of the dielectric constant or a variation of the resistance of the sensitive element if it is semi-conducting or metal. The sensitive element 2 must present a low calorific mass and favor conversion of a thermal variation into an electrical variation.

The sensitive element 2 can for example be polycrystalline or amorphous silicon, of p or n type, having a low or high resistivity, or be in the form of a vanadium oxide deposited in a semi-conducting phase. For a metal sensitive element, it can for example be made of nickel, titanium nitride (TiN), titanium or platinum. The sensitive element 2 can also be replaced by a matrix of sensitive elements.

The variation of the electrical property of the sensitive element 2 is measured by electrodes 4. The electrodes are arranged on the surface of the sensitive element 2 which forms a micro-bridge between support elements 5. The support elements 5, in the form of nails, at the same time form connection elements between the electrodes 4 and the electronic processing circuit 3, so as to enable the electrical properties of the sensitive element 2 between the electrodes 4 to be measured by the circuit 3. The support elements 5 are connected to the circuit 3 by metal connections 6, arranged at the interface of the circuit and of an insulating support 7, itself arranged on the surface of the circuit 3. A reflector 9 can be arranged on the insulating support 7, so as to reflect the infrared radiation to the sensitive element and ensure maximum detection.

To improve the performances of the bolometer, it is known to arrange it inside a tightly sealed protective housing 8, thus performing micro-encapsulation, and to keep it in a vacuum or in a low heat-conducting gas. The base of the protective housing 8 is preferably formed by the circuit 3, whereon the bolometer 1 is mounted. The housing 8 also comprises, at its top part, a window transparent to the wavelength range detected by the bolometer.

The protective housing 8 can be achieved by the usual microelectronics techniques adapted to microtechnologies. Thus, a first layer 10, designed to form the cover of the protective housing 8 and to bound a cavity 12 is deposited on a sacrificial layer, which is then removed by etching so as to form the cavity 12. A vent 13 is disposed between the cover and the base of the housing 8, so as to place the bolometer in a controlled atmosphere or in a vacuum. A sealing layer 11 is subsequently deposited in a vacuum on the first layer 10, making the cavity 12 tight.

According to the invention, at least the top wall of the protective housing 8 of the first detector comprises the second detector 30, detecting a second range of wavelengths. The top wall is preferably itself formed by the second detector. The wavelengths of the first range detected by the first detector are preferably higher than the wavelengths of the second range. The second range of wavelengths is preferably comprised in the visible, ultraviolet or X-ray range and the second detector can for example be a photovoltaic, photoconductive or phototransistor detector.

Figure 2:
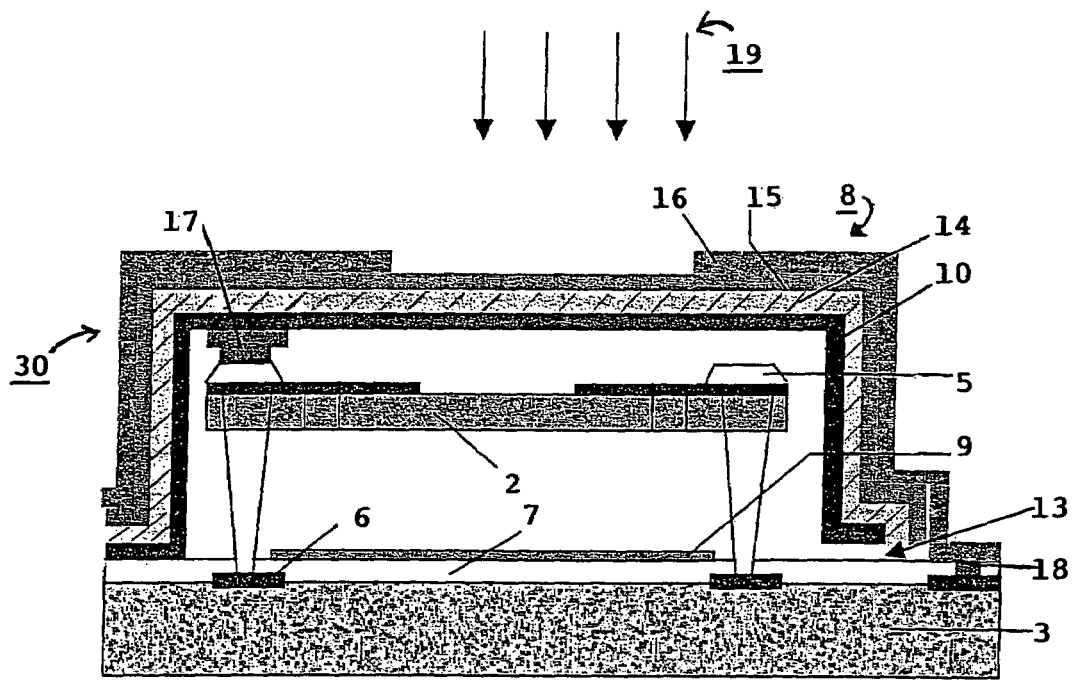
FIGS. 2 to 4 are schematic cross-sectional representations of several embodiments of a detection device according to the invention, comprising a visible photodiode.

According to a first embodiment represented in FIG. 2, the second detector 30 is a photodiode of pin or nip type detecting visible wavelengths. The photodiode forms the cover of the protective housing 8 the base whereof is formed, for example, by the electronic processing circuit 3. The second detector then constitutes the top and side walls of the protective housing. A first layer 10 of the cover of the housing 8 is a layer made of positively (p) or negatively (n) doped semi-conducting material. It is covered by a second intrinsic layer (i) 14, itself covered by a third layer 15, either n-doped if the first layer 10 is p-doped, or p-doped if the first layer 10 is n-doped.

Lighting by visible radiation generates, within the photodiode, a number of carriers proportional to the light energy absorbed by the photodiode, which converts the absorbed light into electric signals. The electric signals are then measured by the electronic processing circuit 3, which stores and processes the electric signals. The connection between the photodiode and the circuit 3 is achieved by two electrodes.

The first ohmic contact of the photodiode is ensured by a metal electrode 17 arranged between the first layer 10 and a support element 5. The support element 5 then also acts as connection element between the first layer 10 and the electronic processing circuit 3. The second ohmic contact is achieved by a transparent electrode 16 deposited on a part of the third layer 15, so as to leave a second upper part of the layer 15 free. As the electrode is transparent, it can also cover the layer 15 totally, which is not possible with an opaque electrode, for example an electrode made of aluminium. The transparent electrode 16 is connected to the electronic processing circuit 3 by at least one pad 18 ensuring the electric contact between the electrode 16 and circuit 3. The pad 18 is arranged at the interface of the transparent electrode 16 and circuit 3, in the bottom part of the housing 8. The first ohmic contact between the layer 10 and circuit 3, performed by the metal electrode 17, can also be taken directly on the circuit 3 in the same way as the second ohmic contact 18, instead of passing via the support element 5.

The layers 10 and 15 are preferably made from a-Si:H or a-SiC:H, of p or n type and have a thickness comprised between 0.01 µm and 1 µm. The layer 14 is made from a-Si:H or a-SiGe:H, with a thickness comprised between 0.05 µm and 5 µm. The transparent electrode 16 can be achieved by conducting oxides such as ZnO, $SnO_2$ or ITO (indium tin oxide), deposited by active cathode sputtering. The pin type photodiode can be either monochromatic or polychromatic and can be replaced by a pn, avalanche or Schottky photodiode.

The detection device presents the advantage of detecting two different wavelength ranges from a same incident beam, without having to separate it into two beams. Detection of the two wavelength ranges is performed at the level of the sensitive element 2 for the first range and at the level of the protective housing for the second range. The material constituting the second detector absorbs the radiation of the second wavelength range (visible in the case of the pin type photodiode) totally, but transmits the radiation of the first wavelength range (infrared in the case of the bolometer), which results in a temperature increase, followed by a variation of an electrical quantity of the sensitive element 2.

Figure 3:
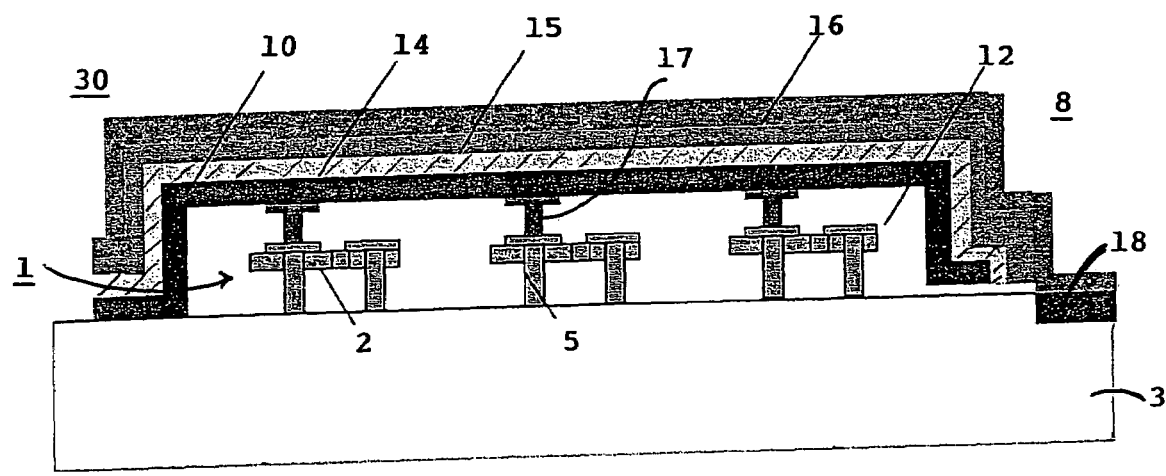

According to an alternative embodiment represented in FIG. 3, the detection device comprises a plurality of first detectors arranged inside the same protective housing 8. The first detectors are bolometers 1 of the same type as those described above and the cover of the protective housing is formed by pin type photodiodes forming the second detector 30. In this case, the transparent electrode 16 can be common to all the photodiodes and is connected to the circuit 3 by a pad 18. Connection between the first p-doped or n-doped layer 10 and the circuit 3 is performed by metal electrodes 17 arranged under the first layer 10 and connected to each support element 5 of each first detector. The use of thin film microstructures enables an efficient thermal insulation of the bolometric detectors to be achieved with respect to the circuit 3.

The protective housing 8 can also comprise a plurality of reticulated zones arranged above each first detector, so that each zone comprises a second detector. Thus either the first p-doped or n-doped layer 10, or the third n-doped or p-doped layer 15 can be etched so as to insulate the zones above each first detector and define a pin or nip type photodiode above each first detector.

Figure 4:
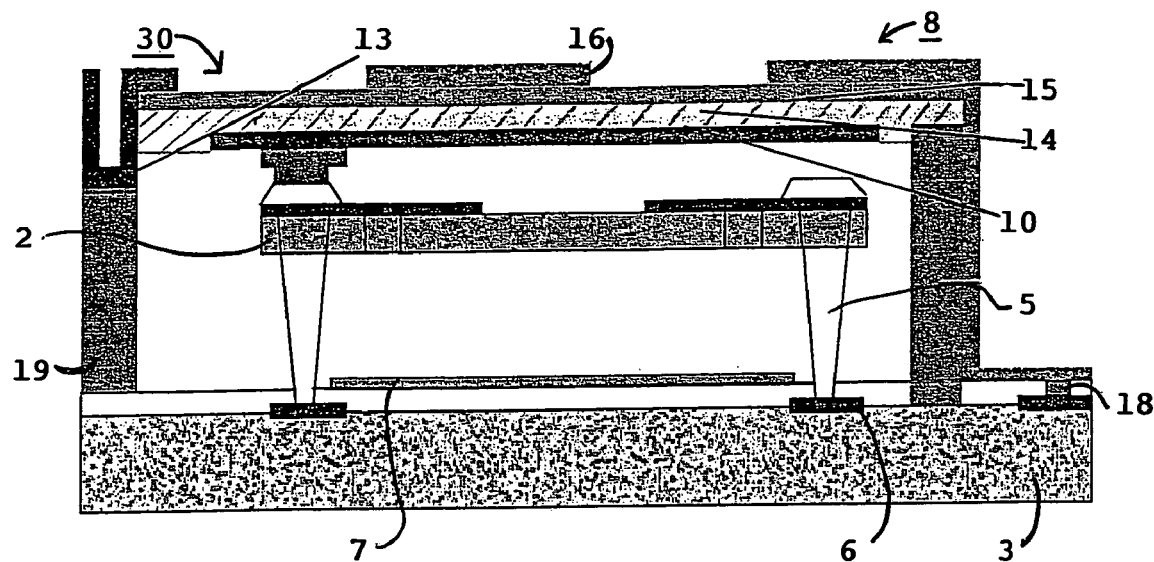

In another embodiment represented in FIG. 4, the pin type photodiode(s) constitute(s) the top wall of the protective housing 8 only, opposite the base that is formed by the circuit 3. The housing also comprises side walls 19, supporting the top wall and forming, with the photodiode, the cover of the housing 8. The first layer 10 of the photodiode can be reticulated. In this case, the vent 13 can be arranged in the top part of the cover of the housing 8, as represented in FIG. 4.

Figure 5:
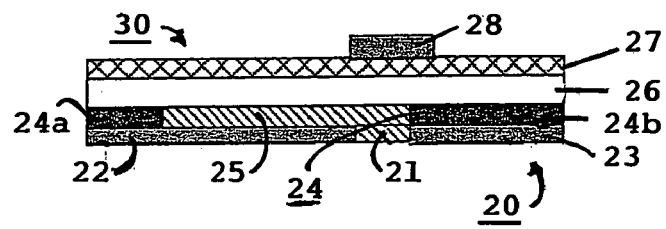
FIG. 5 is a representation of an embodiment of a phototransistor of a detection device according to the invention.

The second detector 30 can also be a phototransistor or phototransistors such as the one represented in FIG. 5. The phototransistor, detecting in the visible range, comprises a first metal layer 20 comprising an insulation zone 21 separating the layer into two parts, one forming a first metallization zone 22, whereas the other forms a second metallization zone 23 insulated from the first zone 22. A second n+ doped semi-conducting layer 24 made from a-Si:H or a-SiC:H is arranged on the first metallization zone 22 to constitute the phototransistor source 24a and on the second metallization zone 23 to constitute the phototransistor drain 24b. It comprises an insulation zone 25 covering the insulation zone 21 and a part of the metallization.

A third semi-conducting layer 26 made from a-Si:H or a-SiGe:H, forming an intrinsic layer, covers the second layer 24. A fourth insulating layer 27 is arranged on the third layer 26. The fourth layer 27 is designed to insulate the third layer 26 from a gate 28 arranged on a part of the fourth layer 27 and made of conducting material transparent to the second wavelength range.

The transistor drain 24b and source 24a are connected to support elements 5, which thus polarize both the phototransistor and the sensitive element 2 of the bolometer 1. The thickness of the second layer 24 is comprised between 0.01 μm and 1 μm, whereas the third layer 26 has a thickness of about 0.05 μm, for visible or ultraviolet radiation detection. For X-ray detection, the material forming the intrinsic layer 26, for example CdTe, has a thickness of about a few hundred μm.

According to a particular embodiment, the steps for fabricating a detection device according to the invention are as follows:

Fabrication of at least one micro-bolometer sensitive element or micro-bridge on a first sacrificial layer, for example made of polyimide, of a thickness comprised between 1 μm and 5 μm, this thickness being preferably equal to a quarter of the wavelength to be detected. A plurality of sensitive elements can be achieved so as to form a detector matrix.

Deposition of a sacrificial layer of polyimide of a thickness comprised between 0.2 μm and 5 μm.

Fabrication of the support elements 5 and connection elements by the usual deposition and etching techniques. They also perform the function of reinforcement as far as collective protection of a matrix of sensitive elements or of several bolometers is concerned. The metal support elements 5, preferably chosen from titanium, titanium nitride, platinum, aluminium, gold, tungsten, nickel and chrome, are made up from layers deposited by cathode sputtering, by a CVD process or by evaporation. The shape of these elements is then obtained by chemical or plasma etching processes, or by a localized deposition process using resin referred to as lift off.

Dry etching of the whole of the first and second sacrificial layers at the periphery of the matrix in the case of a collective housing or of the detector in the case of an individual housing. Dry etching can be performed by a plasma process with oxygen by radiofrequency or micro-wave or by means of an ozonizer.

Performing depositions of the layers forming the walls of the protective housing and a UV-Visible detector, while generating a vent. The thickness of the layers forming the walls of the housing and of the detector is comprised between 0.01 μm and 10 μm. The depositions are performed by a PECVD (Plasma Enhanced Chemical Vapor Deposition) process, by a sputtering process or by means of a hot filament.

Dry etching through the vent of the whole of the first and second remaining layers, inside the protective housing by the same processes as before so as to form the cavity 12.

Deposition of the tight layer enabling sealing of the cavity and simultaneous control of the atmosphere in the cavity 12 to be performed. In the embodiment of FIG. 2, this layer is formed by the transparent electrode 16 and can be made of metallic material of a thickness comprised between 0.5 μm and 5 μm. This may also involve antireflection layers deposited by evaporation or sputtering.

Performing an additional antireflection deposition if required.

Separation of the devices by the usual cutting techniques.

The invention is not limited to the above embodiments. Thus the first and second detectors can also be achieved in the form of arrays comprising several detectors arranged side by side or in the form of a two-dimensional or mosaic network.

The invention claimed is:

1. Electromagnetic radiation detection device comprising two superposed detectors, a first non-cooled detector detecting a first range of wavelengths and a second non-cooled detector detecting a second range of wavelengths, different from the first range of wavelengths, wherein the first detector is arranged inside a tightly sealed protective housing, at least a top wall of the protective housing comprising the second detector.

2. Detection device according to claim 1, wherein the wavelengths of the first range are higher than the wavelengths of the second range.

3. Detection device according to claim 1, wherein the housing comprises a base formed by an electronic processing circuit, whereon the first detector is mounted.

4. Detection device according to claim 3, wherein it comprises electrical connection elements between the second detector and the circuit.

5. Detection device according to claim 4, wherein it comprises support elements of the first detector constituting electrical connection elements between the first detector and/or the second detector and the electronic processing circuit.

6. Detection device according to claim 1, wherein at least the top wall of the protective housing is formed by the second detector.

7. Detection device according to claim 6, wherein the second detector forms the top and side walls of the protective housing.

8. Detection device according to claim 1, wherein the first range of wavelengths is comprised in the infrared range.

9. Detection device according to claim 8, wherein the first detector is a bolometer, a thermocouple or a diode.

10. Detection device according to claim 1, wherein the second range of wavelengths is comprised in the visible or ultraviolet range.

11. Detection device according to claim 10, wherein the second detector is a photovoltaic, photoconductive or phototransistor detector.

12. Detection device according to claim 1, wherein the second range of wavelengths is comprised in the X-ray range.

13. Detection device according to claim 1, wherein it comprises a plurality of first detectors arranged inside the same protective housing.

14. Detection device according to claim 13, wherein the wall of the protective housing comprises a plurality of reticulated zones arranged above each first detector, so that each reticulated zone comprises a second detector.

* * * * *